US010386590B2

(12) United States Patent
Leigh et al.

(10) Patent No.: US 10,386,590 B2
(45) Date of Patent: Aug. 20, 2019

(54) MULTI-CHIP MODULE

(71) Applicant: Hewlett Packard Enterprise Development LP, Houston, TX (US)

(72) Inventors: Kevin Leigh, Houston, TX (US); George Megason, Spring, TX (US); John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/569,326

(22) PCT Filed: Jul. 31, 2015

(86) PCT No.: PCT/US2015/043189
§ 371 (c)(1),
(2) Date: Oct. 25, 2017

(87) PCT Pub. No.: WO2017/023257
PCT Pub. Date: Feb. 9, 2017

(65) Prior Publication Data
US 2018/0120525 A1   May 3, 2018

(51) Int. Cl.
*G02B 6/12* (2006.01)
*G02B 6/42* (2006.01)
*H01L 23/373* (2006.01)
*H01L 25/065* (2006.01)
*H01L 23/367* (2006.01)
*H01L 23/40* (2006.01)

(52) U.S. Cl.
CPC ......... *G02B 6/4269* (2013.01); *G02B 6/4201* (2013.01); *G02B 6/4274* (2013.01); *H01L 23/373* (2013.01); *H01L 25/0657* (2013.01); *G02B 6/428* (2013.01); *G02B 6/4246* (2013.01); *G02B 6/4284* (2013.01); *H01L 23/367* (2013.01); *H01L 23/4006* (2013.01); *H01L 2924/14* (2013.01); *H01L 2924/1433* (2013.01)

(58) Field of Classification Search
CPC ... G02B 6/4269; G02B 6/4274; H01L 23/373; H01L 25/0657; H01L 2924/1433
See application file for complete search history.

(56) References Cited

U.S. PATENT DOCUMENTS 5,430,611 A * 7/1995 Patel ..................... H01L 23/433
                                                            257/724
6,132,104 A   10/2000 Bliss
6,252,726 B1   6/2001 Verdiell
(Continued)

FOREIGN PATENT DOCUMENTS

JP       2003297989      10/2003
WO    WO-2013165356      11/2013

OTHER PUBLICATIONS

Schletz, A.; "Packaging for Electronics," May 9, 2014, 2 pps.
(Continued)

*Primary Examiner* — Ellen E Kim
(74) *Attorney, Agent, or Firm* — McDermott Will & Emery

(57) ABSTRACT

One example of a multi-chip module includes a substrate, a semiconductor chip, and an optical transceiver. The substrate has a first side and a second side opposite the first side. The semiconductor chip is electrically coupled to the first side of the substrate. The optical transceiver is electrically coupled to the second side of the substrate.

15 Claims, 8 Drawing Sheets

(56) References Cited

U.S. PATENT DOCUMENTS

| | | | |
|---|---|---|---|
| 6,270,262 B1 | 8/2001 | Hudgins et al. | |
| 6,353,329 B1 | 3/2002 | Kiffe | |
| 6,512,861 B2* | 1/2003 | Chakravorty | G02B 6/42 385/14 |
| 6,768,642 B2 | 7/2004 | Hines | |
| 7,470,069 B1 | 12/2008 | Offrein | |
| 7,539,026 B2 | 5/2009 | Finnerty | |
| 7,736,183 B2 | 6/2010 | Trout | |
| 8,290,008 B2 | 10/2012 | Andry | |
| 8,425,246 B1 | 4/2013 | Heng | |
| 8,470,682 B2 | 6/2013 | Anderson | |
| 8,905,632 B2 | 12/2014 | Shastri et al. | |
| 9,054,812 B2 | 6/2015 | Yagisawa et al. | |
| 9,112,616 B2* | 8/2015 | McColloch | G02B 6/4201 |
| 9,543,226 B1* | 1/2017 | Nuttall | H01L 23/13 |
| 2006/0078248 A1* | 4/2006 | Sasaki | G02B 6/4214 385/14 |
| 2009/0075499 A1 | 3/2009 | Szu | |
| 2010/0072587 A1 | 3/2010 | Naito | |
| 2010/0103605 A1 | 4/2010 | Jafari | |
| 2012/0058670 A1 | 3/2012 | Regnier et al. | |
| 2012/0267797 A1* | 10/2012 | Haba | H01L 23/3128 257/777 |
| 2012/0326290 A1 | 12/2012 | Andry | |
| 2013/0082372 A1 | 4/2013 | Lin | |
| 2013/0230272 A1 | 9/2013 | Raj et al. | |
| 2013/0279115 A1 | 10/2013 | Blumenthal | |
| 2014/0063743 A1 | 3/2014 | Chan et al. | |
| 2014/0253728 A1 | 9/2014 | Glockler | |
| 2014/0266416 A1 | 9/2014 | Dally | |
| 2014/0327126 A1 | 11/2014 | Narasimhan | |
| 2017/0148703 A1* | 5/2017 | Miura | G02B 6/4269 |

OTHER PUBLICATIONS

International Search Report and Written Opinion received for PCT Patent Application No. PCT/US2015/043189, dated Apr. 28, 2016, 11 pages.

International Preliminary Report on Patentability received for PCT Patent Application No. PCT/US2015/043189, dated Feb. 15, 2018, 10 pages.

European Search Report and Search Opinion Received for EP Application No. 15900526.3, dated Oct. 5, 2018, 13 pages.

Labounty, C.J. et al., Integrated Cooling for Optoelectronic Devices, (Research Paper), Apr. 19, 2000, 7 Pages.

PCT International Search Report issued in Appl. No. PCT/US2015/042315; dated Apr. 25, 2016; 9 pages.

* cited by examiner

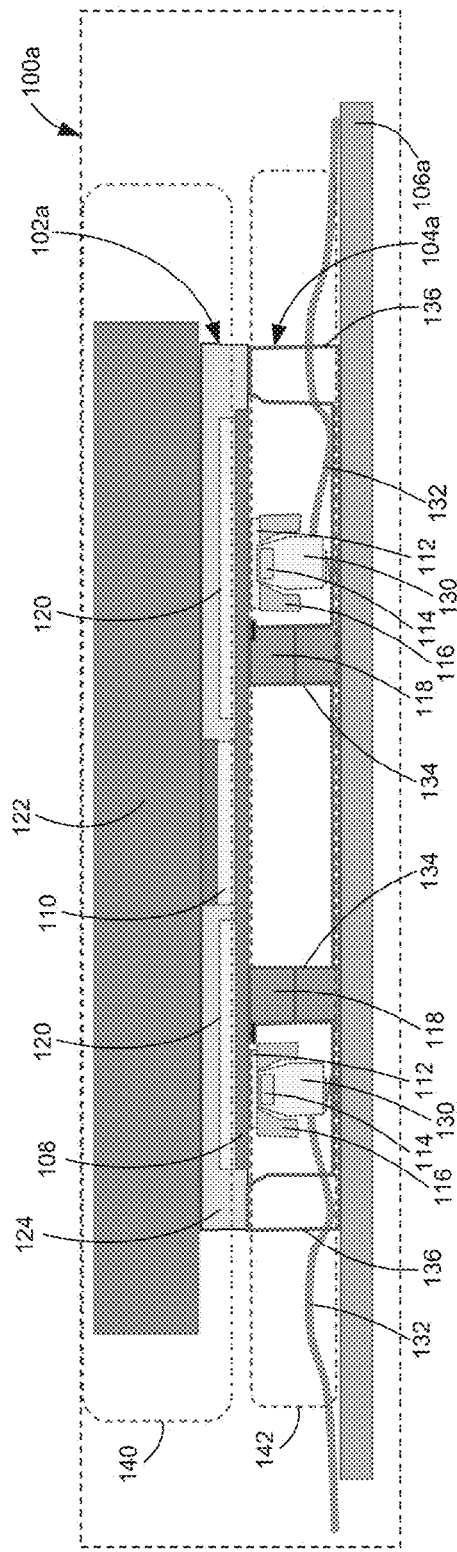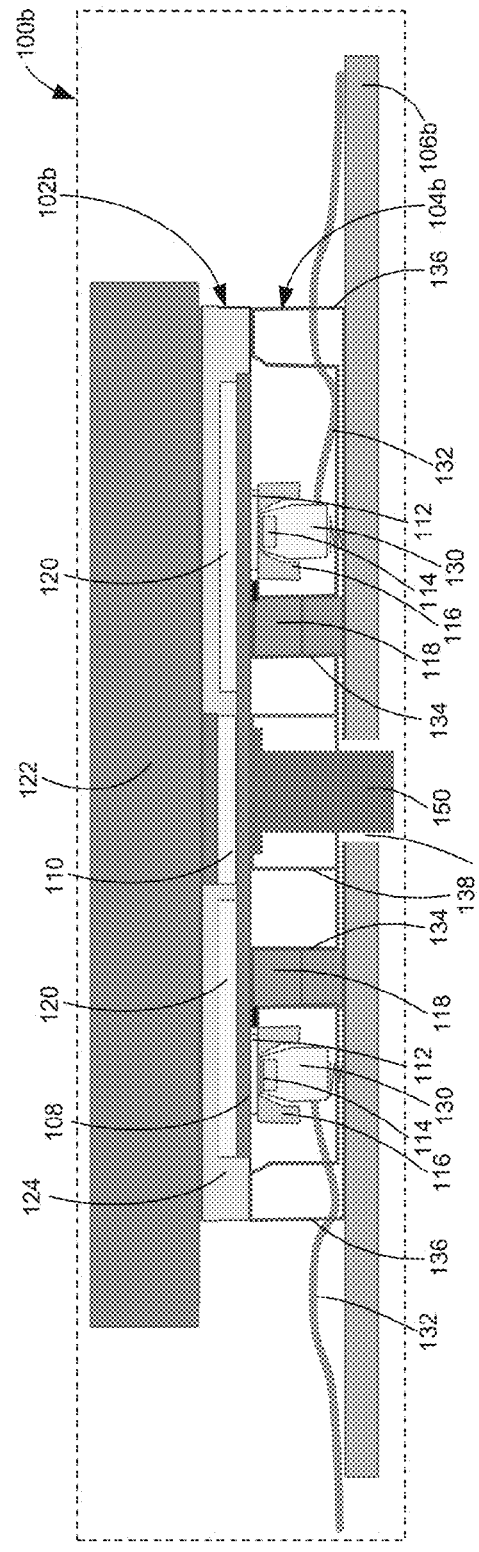

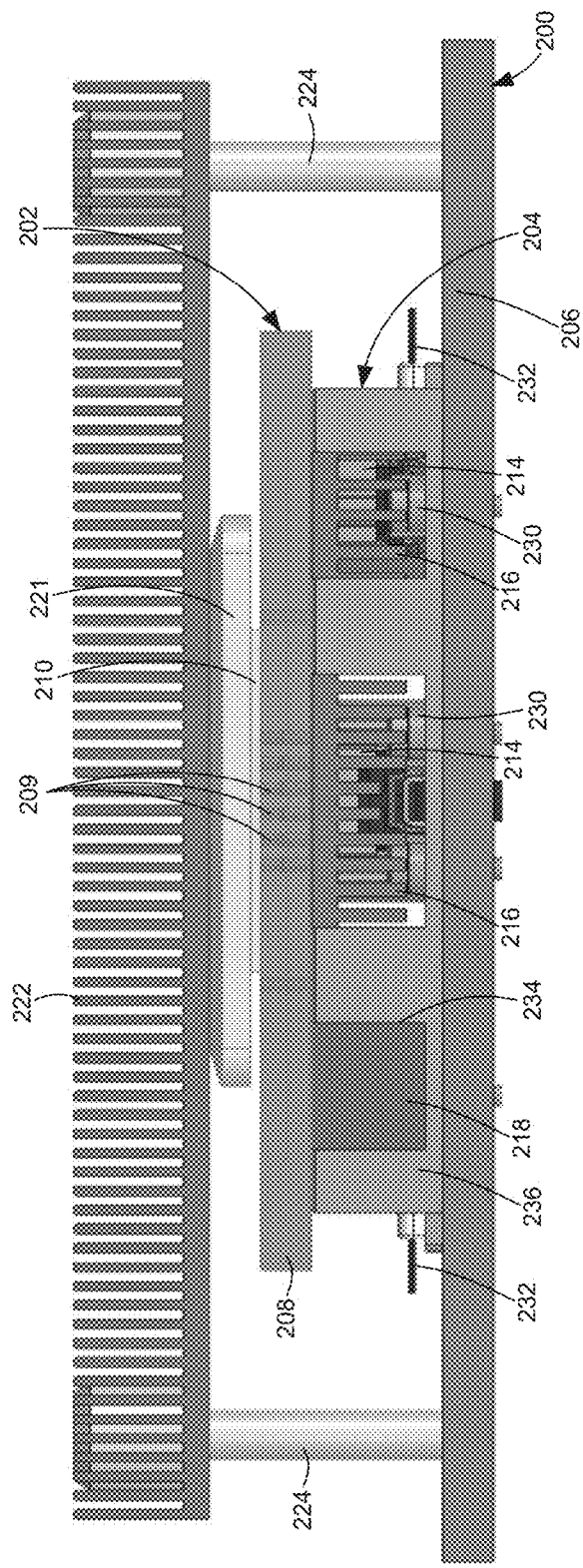

MULTI-CHIP MODULE

BACKGROUND

Large pad-count integrated circuits (ICs) may use over half of the pads for high-speed input/output (I/O) signals and associated grounds. High-radix chips, such as a switch application specific integrated circuit (ASIC) or processor, use the majority of the pads for high-speed differential electrical signals and associated grounds. A 128-lane switch chip may have over 2000 pads and a processor may have over 3000 pads.

BRIEF DESCRIPTION OF THE DRAWINGS

FIG. 1 illustrates a cross-sectional view of one example of a mezzanine-style multi-chip module (MCMezz) installed in a system.

FIG. 2 illustrates a cross-sectional view of another example of a MCMezz installed in a system.

FIG. 3 illustrates a side view of another example of a MCMezz installed in a system.

DETAILED DESCRIPTION

Figure 4A:
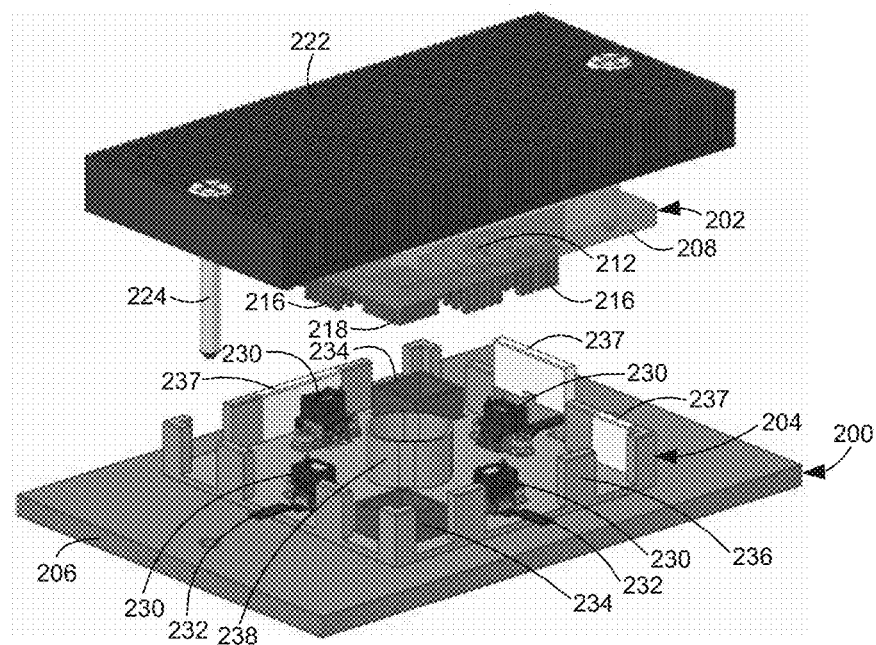
FIG. 4A illustrates a top isometric view and FIG. 4B illustrates a bottom isometric view of one example of a MCMezz prior to installation in a MCMezz socket.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Large pad-count packages may introduce mechanical, electrical, and cost challenges such that future generations of ICs may not be scaled efficiently for capacity and performance. These large pad-count ICs cannot be efficiently scaled for I/O speed and/or density due to packaging and thermal issues. These electrical I/O issues may be solved by co-packaging optical transceivers with the IC packages and using optical connectors to egress high-speed signals. Optical transceivers, however, are sensitive to high temperatures and have significant wear-out reliability issues when operating within the same package as high-power ICs. Localized cooling methods (e.g., thermal electric cooling (TEC)) or thermal isolation methods (e.g., specialty heat sinks) may be used but these methods may not be practical, reliable, or economical. In addition, if optical transceivers are used in an IC package, optical fibers egressing from the IC package can impede air flow across the heat sink of the IC. Moreover, user-friendliness and connection reliability issues may arise when a large number of optical fibers are connected to an IC.

Accordingly, this disclosure describes an assembly including a mezzanine-style multi-chip module (MCMezz). The MCMezz may include a semiconductor chip (e.g., an ASIC chip) and associated heat sink on the top side of a substrate and optical transceiver chips and associated heat sinks on the bottom side of the substrate. The bottom side of the substrate may also include electrical connectors for power, management signals, and high-speed signals. The MCMezz may include blindmate features to align the MCMezz with optical connectors of a MCMezz-socket of a system. Heat may be extracted from the MCMezz from both the top and bottom sides of the MCMezz. Different thermal zones of the MCMezz may be isolated from each other.

FIG. 1 illustrates a cross-sectional view of one example of a MCMezz 102a installed in a system 100a. MCMezz 102a includes a substrate 108 (e.g., a printed circuit board (PCB)), an ASIC 110, optical transceivers 112, optical connectors 114, a first heat sink 122, second heat sinks 116, electrical connectors 118, thermal insulation layers 120, and a support structure 124. ASIC 110 is electrically coupled to the top surface of substrate 108, and optical transceivers 112 and electrical connectors 118 are electrically coupled to the bottom surface of substrate 108. Substrate 108 includes signal traces to electrically couple ASIC 110 to each optical transceiver 112 and each electrical connector 118.

In one example, ASIC 110 is arranged substantially at the center of substrate 108, and optical transceivers 112 are arranged to the sides of ASIC 110 and laterally spaced apart from ASIC 110. An optical connector 114 is coupled to each optical transceiver 112 for optically coupling each optical transceiver 112 to system 100a. A second heat sink 116 is thermally coupled to each optical transceiver 112. Each second heat sink 116 may surround each optical transceiver 112 and optical connector 114.

Electrical connectors 118 are electrically coupled to and extend from the bottom surface of substrate 108. Each electrical connector 118 is for electrically coupling MCMezz 102a to system 100a. In one example, electrical connectors 118 pass power, management signals, and high-speed signals between system 100a and MCMezz 102a. In another example, electrical connectors 118 pass only power and management signals between system 100a and MCMezz 102a. A thermal insulation layer 120 is arranged on the top surface of substrate 108 over each optical transceiver 112 and electrical connector 118 to thermally insulate optical transceivers 112 from ASIC 110. Each thermal insulation layer 120 may include graphene or another suitable thermally insulating material. First heat sink 122 is thermally coupled to ASIC 110 to extract heat from ASIC 110. In one example, first heat sink 122 may include fins for forced air cooling. In another example, first heat sink 122 may include a flat surface for liquid cooled cold plates (not shown) to contact. Support structure 124 contacts first heat sink 122 and supports substrate 108. In one example, support structure 124 includes alignment features to blindmate MCMezz 102a to MCMezz socket 104a.

System 100a includes a system board 106a and a MCMezz socket 104a. MCMezz socket 104a is mechanically and electrically coupled to system board 106a. MCMezz socket 104a includes optical connectors 130, optical cables 132, electrical connectors 134, and a support structure 136. Each optical connector 130 is to mate with a corresponding optical connector 114 of MCMezz 102a. Each optical connector 130 is optically coupled to an optical cable 132 for communicating optical signals between system 100a and MCMezz 102a. In one example, each optical connector 130 and/or optical connector 114 includes alignment features to blindmate each optical connector 130 to the corresponding optical connector 114. In another example, each optical connector 130 with optical cable 132 may be manually mated to corresponding optical connectors 114 prior to mating MCMezz 102a to MCMezz socket 104a.

Each electrical connector 134 is to mate with a corresponding electrical connector 118 of MCMezz 102a. Each electrical connector 134 is electrically coupled to system board 106a for communicating electrical signals, such as power, management signals, and high-speed signals between system 100a and MCMezz 102a. In one example, each electrical connector 134 and/or electrical connector 118 includes alignment features to blindmate each electrical connector 134 to the corresponding electrical connector 118. Support structure 136 contacts support structure 124 of MCMezz 102a and may set the spacing between MCMezz 102a and system board 106a. In one example, support structure 136 includes alignment features to blindmate MCMezz 102a to MCMezz socket 104a.

By arranging ASIC 110 and first heat sink 122 on the top side of substrate 108 and optical transceivers 112 with second heat sinks 116 on the bottom side of substrate 108, MCMezz 102a separates a high-heat zone indicated by area 140 from a low-heat zone indicated by area 142. Low-heat zone 142 enables thermally sensitive optical transceivers 112 to be cooled separately from high-power ASIC 110.

FIG. 2 illustrates a cross-sectional view of another example of a MCMezz 102b installed in a system 100b. MCMezz 102b is similar to MCMezz 102a previously described and illustrated with reference to FIG. 1, except that MCMezz 102b includes a heat rod 150. Heat rod 150 is thermally coupled to the bottom surface of substrate 108 opposite to ASIC 110 to drain heat from power and/or ground islands within substrate 108. Heat rod 150 may extend through system board 106b. In this example, ASIC 110 is cooled from both the top side of substrate 108 via first heat sink 122 and from the bottom side of substrate 108 via heat rod 150.

System 100b is similar to system 100a previously described and illustrated with reference to FIG. 1, except that system 100b includes a system board 106b having an opening 107 through which heat rod 150 of MCMezz 102b extends. MCMezz socket 104b is similar to MCMezz socket 104a previously described and illustrated with reference to FIG. 1, except that MCMezz socket 104b includes a center cylindrical column 138 to receive heat rod 150 of MCMezz 102b. Thermal insulation material (not shown) may be applied or wrapped around center cylindrical column 138 to thermally insulate optical transceivers 112 from heat rod 150. Center cylindrical column 138 and support structure 136 support MCMezz 102b when pressure is applied to ASIC 110 due to first heat sink 122.

Figure 4B:
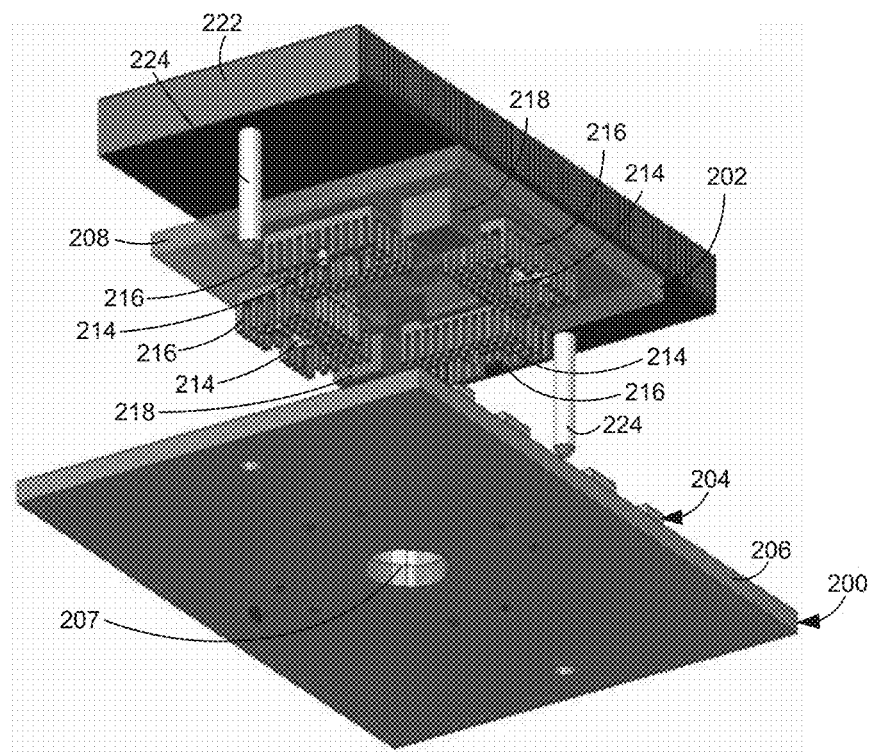

FIG. 3 illustrates a side view of another example of a MCMezz 202 installed in a system 200. FIG. 4A illustrates a top isometric view and FIG. 4B illustrates a bottom isometric view of one example of MCMezz 202 prior to installation in MCMezz socket 204. MCMezz 202 includes a substrate 208 (e.g., a PCB), an ASIC 210, optical transceivers 212 (illustrated in FIG. 4A where one optical transceiver is illustrated on the bottom side of substrate 208 in the transparent view of substrate 208 and also illustrated in FIG. 6A), optical connectors 214, a first heat sink 222, second heat sinks 216, electrical connectors 218, a heat spreader 221, and heat sink retention mechanisms 224.

As illustrated in FIG. 3, ASIC 210 is electrically coupled to the top surface of substrate 208, and optical transceivers 212 are electrically coupled to the bottom surface of substrate 208. Substrate 208 may enable thermal conduction through substrate 208 from ASIC 210 on the top surface of substrate 208 to the bottom surface of substrate 208 via thermal conduction channels 209. The center portion of the bottom side of substrate 208 may be cooled through opening 207 (FIG. 4B) of system board 206 and center cylindrical column 238 (FIG. 4A) of MCMezz socket 204.

In one example, ASIC 210 is arranged substantially at the center of substrate 208, and optical transceivers 212 are arranged to the sides of ASIC 210 and laterally spaced apart from ASIC 210. An optical connector 214 is coupled to each optical transceiver for optically coupling each optical transceiver 212 to system 200. A second heat sink 216 is thermally coupled to each optical transceiver 212. Each second heat sink 216 may surround each optical transceiver 212. In one example as illustrated in FIG. 4B, optical transceivers 212 and associated optical connectors 214 and second heat sinks 216 are arranged on each of the four sides of ASIC 210.

Each electrical connector 218 is to mate with an electrical connector 234 of MCMezz socket 204. Each electrical connector 218 is electrically coupled to substrate 208 for communicating electrical signals, such as power, management signals, and high-speed signals, between MCMezz 202 and system 200. In one example as illustrated in FIG. 4B, MCMezz 202 includes two electrical connectors 218 with one electrical connector 218 electrically coupled to substrate 208 in a first corner of substrate 208 and the other electrical connector 218 electrically coupled to substrate 208 in a second corner of substrate 208 opposite to the first corner.

Heat spreader 221 is thermally coupled to the top surface of ASIC 210. In one example, heat spreader 221 is centered over ASIC 210. First heat sink 222 is thermally coupled to the top surface of heat spreader 221. In one example, first heat sink 222 is centered over heat spreader 221. Heat sink retention mechanisms 224, such as screws or other suitable fasteners, mechanically couple first heat sink 222 to system board 206 and may maintain the electrical and optical coupling between MCMezz 202 and MCMezz socket 204.

System 200 includes a system board 206 and a MCMezz socket 204. MCMezz socket 204 is mechanically and electrically coupled to system board 206. As illustrated in FIG. 4A, MCMezz socket 204 includes optical connectors 230, optical cables 232, electrical connectors 234, and a support structure 236. In one example, MCMezz socket 204 also includes removable sidewall portions 237. Each optical connector 230 is to mate with a corresponding optical connector 214 of MCMezz 202. Each optical connector 230 is optically coupled to a corresponding optical cable 232 for communicating optical signals between system 200 and MCMezz 202.

Each electrical connector 234 is to mate with a corresponding electrical connector 218 of MCMezz 202. Each electrical connector 234 is electrically coupled to system board 206 for communicating electrical signals, such as power, management signals, and high-speed signals, between system 200 and MCMezz 202.

Support structure 236 contacts substrate 208 of MCMezz 202 and may set the spacing between MCMezz 202 and system board 206 with MCMezz 202 installed in system 200. In one example, support structure 236 includes removable side wall portions 237 that may be installed or removed from support structure 236 for optical cable management and/or for controlling an airflow path through MCMezz socket 204. Support structure 236 may include alignment features to blindmate MCMezz 202 to MCMezz socket 204.

Figure 5A:
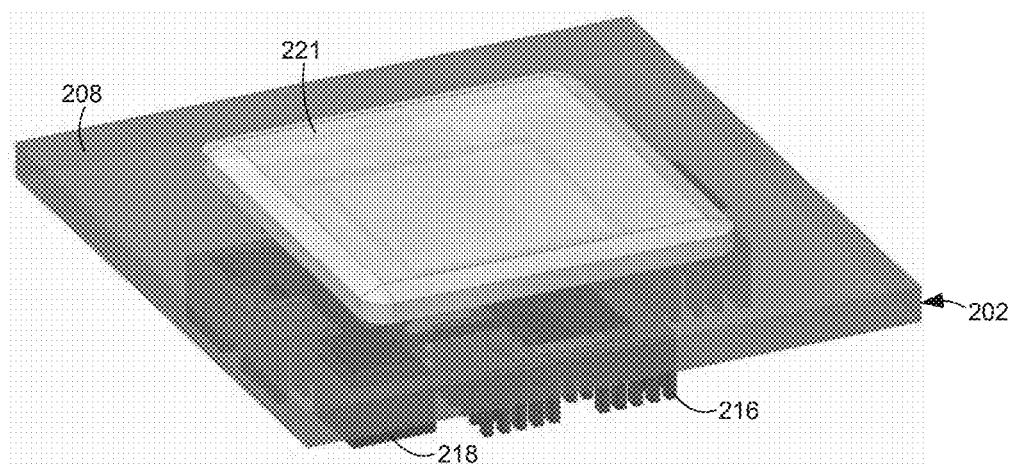
FIG. 5A illustrates a top isometric view and FIG. 5B illustrates a bottom isometric view of one example of a MCMezz.
Figure 5B:
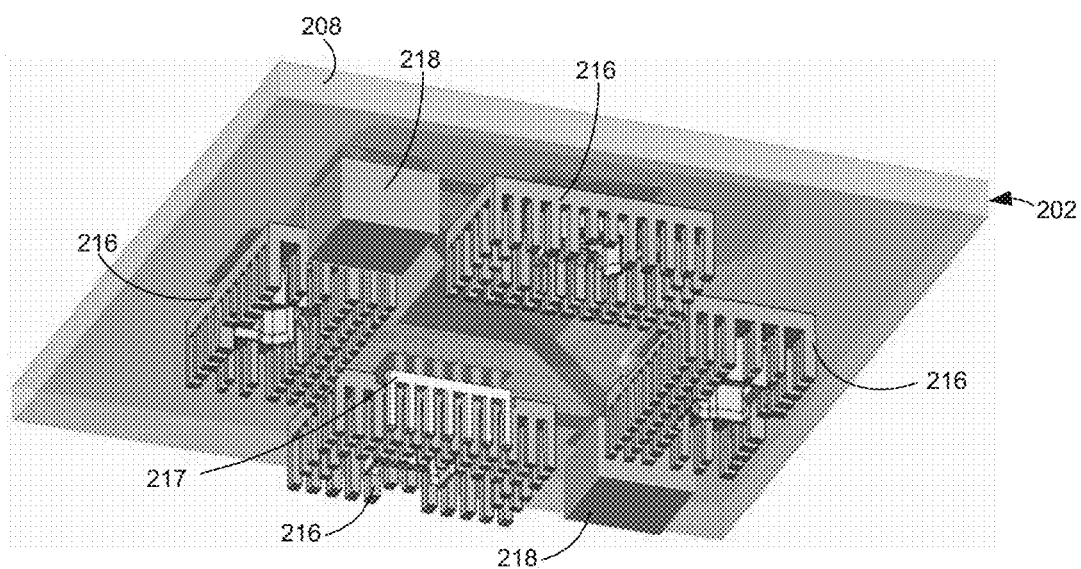

FIG. 5A illustrates a top isometric view and FIG. 5B illustrates a bottom isometric view of one example of MCMezz 202. As previously described, MCMezz 202 includes heat spreader 221 thermally coupled to the ASIC. Heat spreader 221 may be centered on the top side of substrate 208 over the ASIC as illustrated in FIG. 5A. As illustrated in FIG. 5B, MCMezz 202 may also include a heat curtain 217. Heat curtain 217 extracts heat from a power plane island within substrate 208 as will be further described below with reference to FIGS. 6A and 6B. Heat curtain 217 may be arranged in the downstream air flow path of an optical transceiver.

Figure 6A:
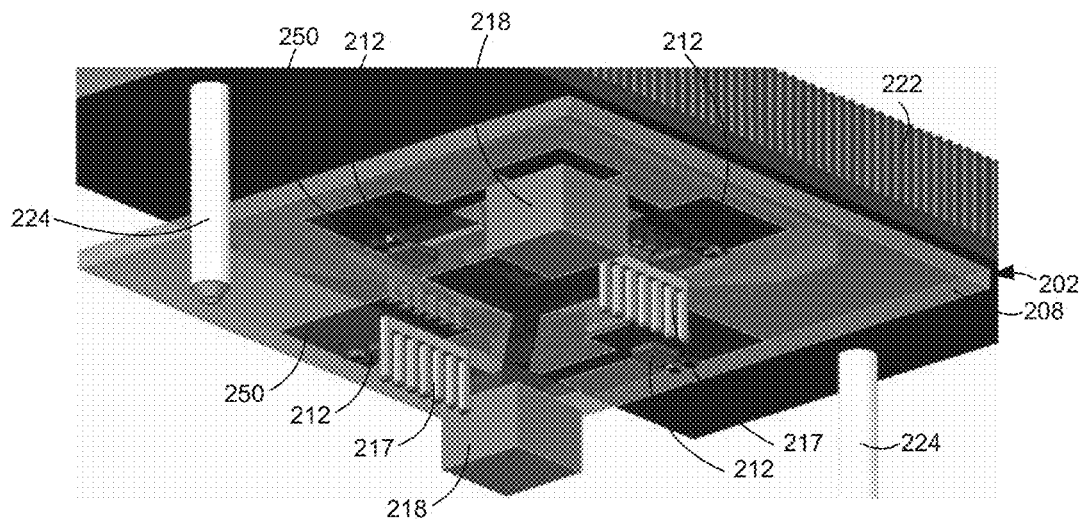
FIG. 6A illustrates a bottom isometric view and FIG. 6B illustrates a top isometric view of one example of a MCMezz including heat curtains.
Figure 6B:
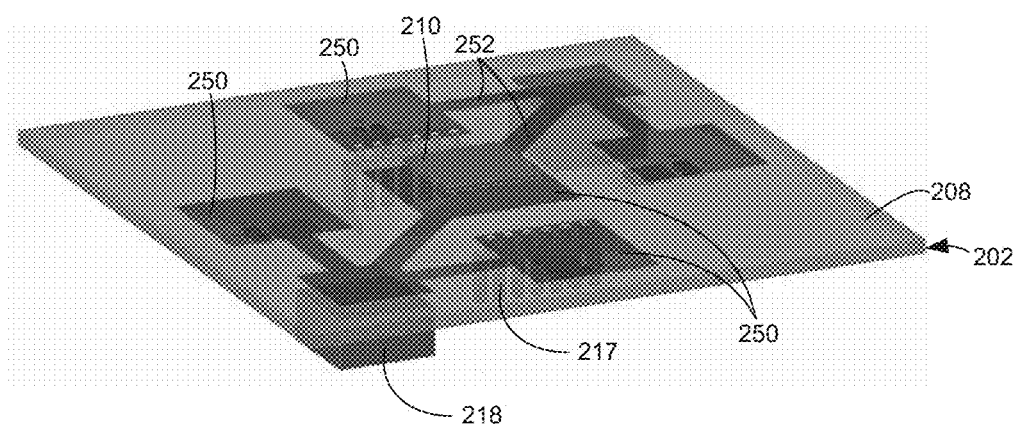

FIG. 6A illustrates a bottom isometric view of one example of MCMezz 202 including heat curtains 217 with optical connectors 214 and second heat sinks 216 removed. FIG. 6B illustrates a top isometric view of one example of MCMezz 202 with heat spreader 221 and first heat sink 222 removed. MCMezz 202 includes multiple power plane islands 250 within substrate 208 to minimize thermal conduction in substrate 208 between ASIC 210 and optical transceivers 212. In one example, substrate 208 includes one power plane island within substrate 208 for ASIC 210, one power plane island within substrate 208 for each optical transceiver 212, and one power plane island within substrate 208 for each electrical connector 218. In one example, power plane islands 250 are ground planes electrically coupled to each other via ground bridges 252. Ground bridges 252 enable impedance controlled high-speed signal coupling traces (not shown) between ASIC 210 and each optical transceiver 212.

In this example, MCMezz 202 includes two heat curtains 217 including a first heat curtain 217 adjacent to a first optical transceiver 212 and a second heat curtain 217 adjacent to a second optical transceiver 212 opposite to the first optical transceiver. Each heat curtain 217 diverts and extracts heat from a power plane island 250 within substrate 208. Each heat curtain 217 may be arranged in the downstream air flow path of the corresponding optical transceiver 212. While FIG. 5B illustrates one heat curtain and FIGS. 6A and 6B illustrate two heat curtains, in other examples MCMezz 202 may include another suitable number of heat curtains with each heat curtain for diverting and extracting heat from a power plane island 250 within substrate 208.

Figure 7A:
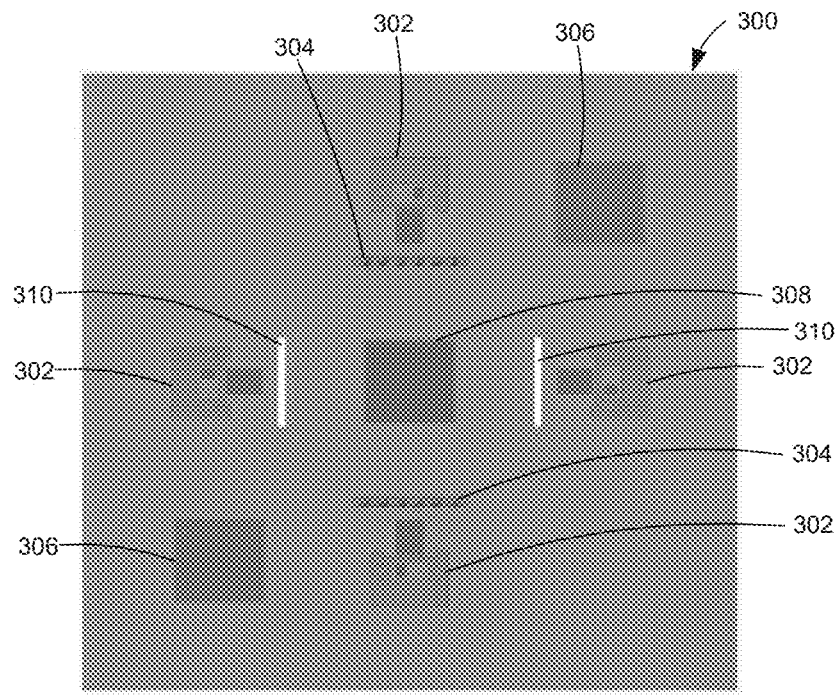
FIGS. 7A-7D illustrate example layers of a substrate of a MCMezz.

FIGS. 7A-7D illustrate example layers of a substrate of a MCMezz, such as substrate 208 of MCMezz 202 (illustrated in FIGS. 6A-6B). Substrate 208 of MCMezz 202 may include additional layers not illustrated in FIGS. 7A-7D. FIG. 7A illustrates one example of a bottom substrate layer 300. Bottom substrate layer 300 includes optical transceiver pads 302 for electrically coupling to optical transceiver chips, heat curtain contacts 304 for electrically coupling to heat curtains, electrical connector pads 306 for electrically coupling to electrical connectors, a thermally conductive pad 308 for extracting heat from a power plane island of the substrate, and heat slots 310. Heat slots 310 are physical voids through the substrate layer to prevent thermal conduction within the substrate from the ASIC towards the optical transceivers.

Figure 7B:
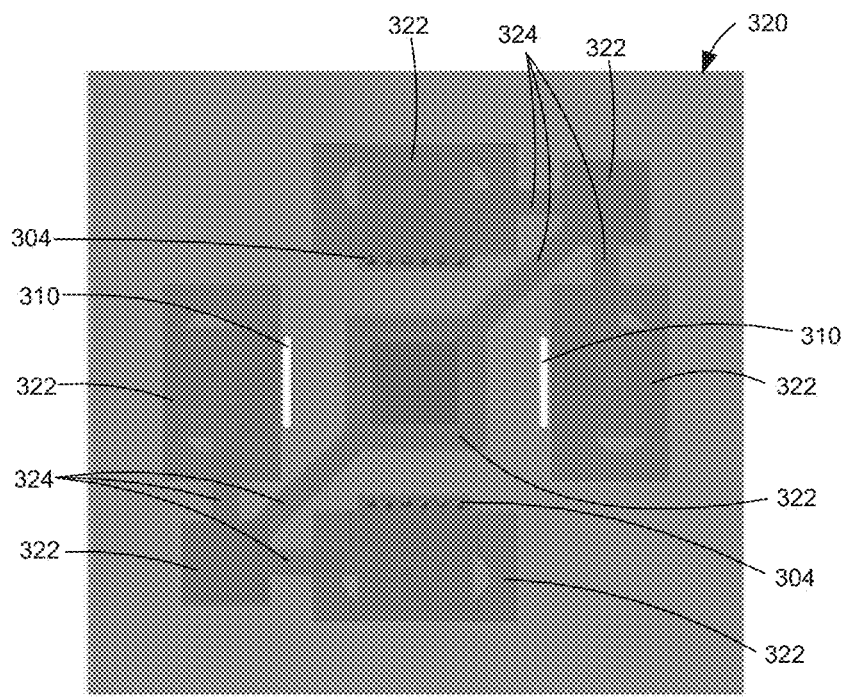

FIG. 7B illustrates one example of an inner substrate layer 320. Inner substrate layer 320 includes ground islands 322 and ground bridges 324 electrically interconnecting ground islands 322. As previously described and illustrated with reference to FIG. 6B, each optical transceiver, each electrical connector, and the ASIC each have their own ground island 322. Inner substrate layer 320 also includes heat curtain contacts 304 and heat slots 310 as previously described and illustrated with reference to FIG. 7A.

Figure 7C:
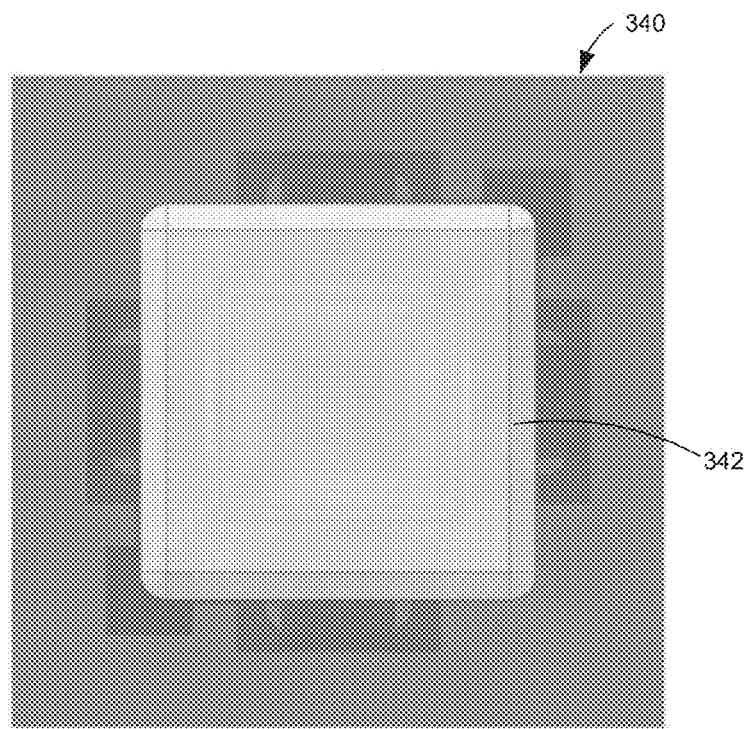
Figure 7D:
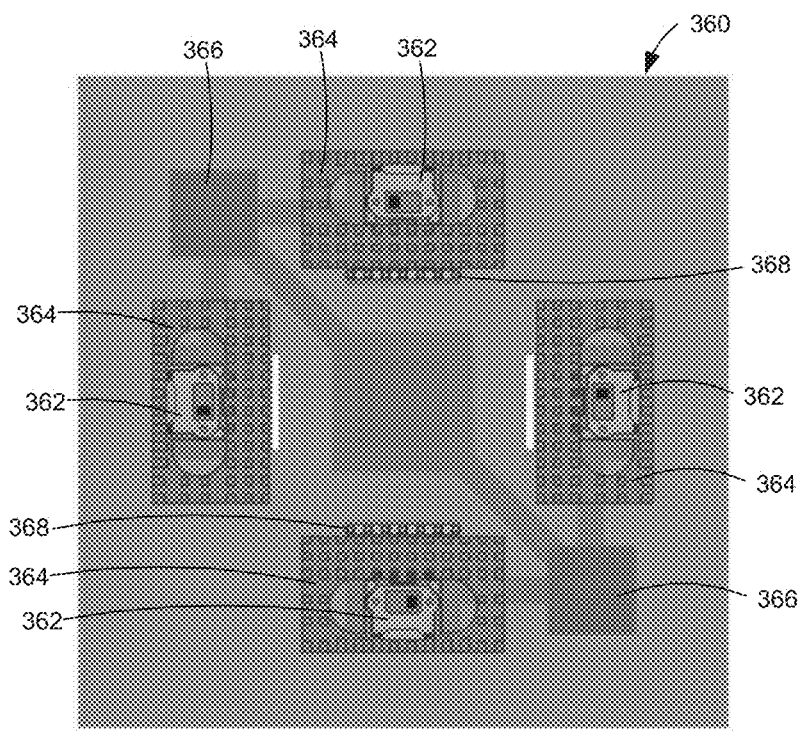

FIG. 7C illustrates a top view of one example of a top substrate layer 340. An ASIC is electrically coupled to top substrate layer 340 and inner layers of the substrate, and a heat spreader 342 is thermally coupled to the top surface of the ASIC. FIG. 7D illustrates a bottom view of one example of a bottom substrate layer 360. Optical transceivers are electrically coupled to bottom substrate layer 360 and inner layers of the substrate. Corresponding optical connectors 362 and heat sinks 364 are coupled to each optical transceiver. Electrical connectors 366 are electrically coupled to bottom substrate layer 360. Heat curtains 368 are thermally coupled to bottom substrate layer 360.

Figure 8A:
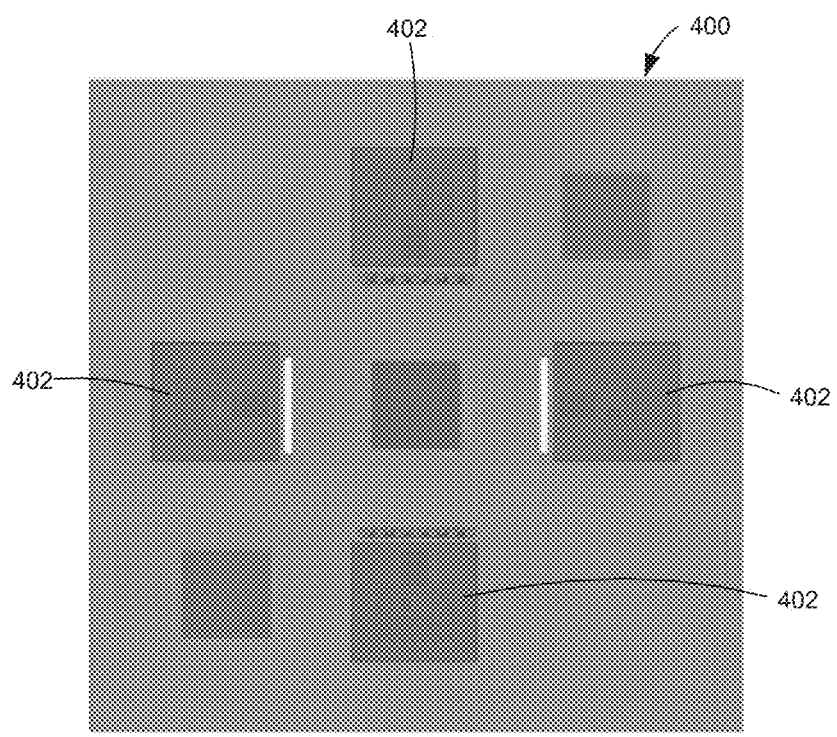
FIGS. 8A and 8B illustrate example layers of a substrate including thermal insulation pads.
Figure 8B:
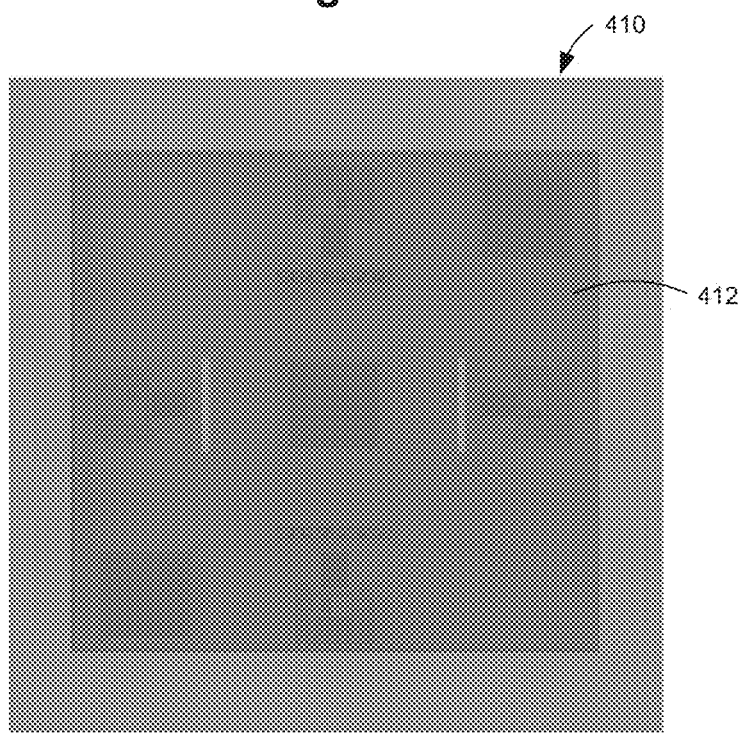

FIGS. 8A and 8B illustrate example layers of a substrate, such as substrate 208 of MCMezz 202, including thermal insulation pads. FIG. 8A illustrates one example of a substrate layer 400 including a plurality of thermal insulation pads 402. Each thermal insulation pad 402 may include graphene or another suitable thermally insulating material. Each thermal insulation pad 402 is arranged in substrate layer 400 and aligned with each power island of each optical transceiver, respectively. Each thermal insulation pad 402 thermally insulates each respective optical transceiver from the ASIC. FIG. 8B illustrates one example of a substrate layer 410 including a thermal insulation pad 412. In this example, thermal insulation pad 412 extends over the power islands of the substrate. Thermal insulation pad 412 may include graphene or another suitable thermally insulating material. Thermal insulation pad 412 thermally insulates the optical transceivers from the ASIC.

A MCMezz as described herein may provide more efficient cooling of high-power and high-heat ASICs. For example, the heat sink may be optimized for the ASIC independently from the optical transceivers and no optical cables block air paths to the heat sink. The MCMezz may provide more efficient cooling of the temperature sensitive optical transceivers. For example, different thermal zones of the MCMezz may be isolated from each other to allow the optical transceivers to have a higher lifetime reliability. In addition, the optical cables underneath the MCMezz are easier to reliably manage.

Further, power and/or ground supplies and management signals may be supported with more robust and/or thick contacts in an electrical connector. Larger contacts have lower current density compared to BGA and LGA style contacts for the same amperage, thus enabling fewer power and/or ground contacts to be used. Low-speed management signals may tolerate long contact wipes, allowing more reliable connectivity when mating in conjunction with the optical connectors. The system board may use fewer PCB layers since the system board does not have to route all or a significant number of differential electrical signals from the MCMezz. Since traces are localized within the MCMezz, lower power serdes with minimum signal conditioning features may be used between the ASIC and the optical transceivers. The PCB material may be independently optimized for the MCMezz and the system board. In addition, the MCMezz enables flexible system configurations by allowing different ASICs and associated optical transceivers and optical infrastructure to be used in a system.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A multi-chip module comprising:
   a substrate having a first side and a second side opposite the first side;
   a semiconductor chip electrically coupled to the first side of the substrate;
   an optical transceiver electrically coupled to the second side of the substrate, wherein the substrate further comprises an optical connector coupled to the optical transceiver on the second side of the substrate;
   a heat rod thermally coupled to the second side of the substrate opposite the semiconductor chip, and configured to drain a heat from the substrate and to cool the semiconductor chip; and
   an electrical connector coupled to the semiconductor chip on the second side of the substrate, wherein the optical transceiver is laterally displaced relative to the semiconductor chip, on the second side of the substrate to provide space for disposing the heat rod and the electrical connector directly below the semiconductor chip.

2. The multi-chip module of claim 1, further comprising a socket of a system board, the socket configured to receive and to secure an optical cable coupled to the optical connector.

3. The multi-chip module of claim 1, further comprising a heat curtain thermally coupled to a ground island, and extending from the second side of the substrate.

4. The multi-chip module of claim 1, wherein the heat rod is thermally coupled to a ground island and extending from the second side of the substrate.

5. The multi-chip module of claim 1, further comprising:
   a first heat sink thermally coupled to the semiconductor chip on the first side of the substrate; and
   a second heat sink thermally coupled to the optical transceiver on the second side of the substrate.

6. A multi-chip module comprising:
   a substrate comprising a plurality of layers;
   a semiconductor chip electrically coupled to a top layer and inner layers of the substrate;
   a plurality of optical transceivers electrically coupled to a bottom layer and inner layers of the substrate;
   a heat rod thermally coupled to the bottom layer of the substrate opposite the semiconductor chip, and configured to drain a heat from the substrate and to cool the semiconductor chip; and
   an electrical connector coupled to the semiconductor chip through the bottom layer of the substrate, wherein:
   an inner layer of the substrate comprises a ground island aligned with the semiconductor chip and a second ground island aligned with one of the optical transceivers, wherein the substrate further comprises an optical connector coupled to one of the optical transceivers on the bottom layer of the substrate, and
   the optical transceivers are laterally displaced relative to the semiconductor chip, on the bottom layer of the substrate to provide space for disposing the heat rod and the electrical connector directly below the semiconductor chip.

7. The multi-chip module of claim 6, further comprising a ground bridge configured to control an impedance profile of signal traces within the substrate between the semiconductor chip and the optical transceiver.

8. The multi-chip module of claim 6, further comprising:
   a first heat sink thermally coupled to the semiconductor chip; and
   a plurality of second heat sinks, each second heat sink thermally coupled to a respective optical transceiver.

9. The multi-chip module of claim 6, further comprising a socket configured to receive and to secure an optical cable coupled to at least one of the optical connectors.

10. The multi-chip module of claim 6, wherein the heat rod is further configured to extract heat from a ground island aligned with the semiconductor chip; and
    a heat curtain to extract heat from a ground island aligned with an optical transceiver.

11. A system comprising:
    an assembly comprising a substrate, a semiconductor chip coupled to a first side of the substrate, and an optical transceiver coupled to a second side of the substrate, the optical transceiver electrically coupled to the semiconductor chip via the substrate;
    a system board;
    a socket coupled to the system board, the socket to receive the assembly to provide an optical connection to the optical transceiver;
    a heat rod thermally coupled to the second side of the substrate opposite the semiconductor chip, and configured to drain a heat from the substrate and to cool the semiconductor chip; and
    an electrical connector coupled to the semiconductor chip on the second side of the substrate, wherein the optical transceiver is laterally displaced, on the second side of the substrate, relative to the semiconductor chip to provide space for disposing the heat rod and the electrical connector directly below the semiconductor chip.

12. The system of claim 11, wherein the assembly further comprises a first electrical connector on the second side of the substrate and electrically coupled to the semiconductor chip via the substrate, and
    wherein the socket further comprises a second electrical connector to mate with the first electrical connector to electrically couple the semiconductor chip to the system board.

13. The system of claim 12, wherein the assembly further comprises a plurality of optical transceivers coupled to the second side of the substrate, each optical transceiver electrically coupled to the semiconductor chip via the substrate,
    wherein the assembly further comprises a third electrical connector on the second side of the substrate and electrically coupled to the semiconductor chip via the substrate, and
    wherein the socket further comprises a fourth electrical connector to mate with the third electrical connector to electrically couple the semiconductor chip to the system board.

14. The system of claim 11, wherein the assembly further comprises a thermal insulator on the first side of the substrate to thermally insulate the optical transceiver from the semiconductor chip.

15. The system of claim 14, wherein the thermal insulator comprises graphene.

* * * * *